(12) United States Patent
Park et al.

(10) Patent No.: US 8,981,390 B2
(45) Date of Patent: Mar. 17, 2015

(54) DISPLAY DEVICE

(71) Applicant: Samsung Display Co., Ltd., Yongin, Gyeonggi-Do (KR)

(72) Inventors: Eun-Kil Park, Cheonan-si (KR); Hyun-Ho Kang, Ansan-si (KR); Yong Woo Hyung, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 25 days.

(21) Appl. No.: 13/858,216

(22) Filed: Apr. 8, 2013

(65) Prior Publication Data

US 2014/0159068 A1 Jun. 12, 2014

(30) Foreign Application Priority Data

Dec. 10, 2012 (KR) .................. 10-2012-0142971

(51) Int. Cl.
 *H01L 27/12* (2006.01)
(52) U.S. Cl.
 CPC .................. *H01L 27/1244* (2013.01)
 USPC .............. 257/88; 438/30; 438/34; 438/48; 438/104; 438/158
(58) Field of Classification Search
 CPC .......... G02F 1/136227; G02F 1/13454; G02F 1/136213; H01L 27/1214; H01L 27/12; H01L 29/66765; H01L 29/78696; H01L 27/1225; H01L 29/7869
 USPC .................. 257/88, 59, 43, 72, 390
 See application file for complete search history.

(56) References Cited

U.S. PATENT DOCUMENTS

| | | | |
|---|---|---|---|
| 5,859,683 A | 1/1999 | Tagusa et al. | |
| 6,639,639 B2 | 10/2003 | Baek et al. | |
| 6,927,814 B2 | 8/2005 | Lee et al. | |
| 7,221,423 B2 | 5/2007 | Park et al. | |
| 7,567,326 B2 | 7/2009 | Lee | |
| 7,742,130 B2 | 6/2010 | Kim | |
| 7,768,601 B2 | 8/2010 | Kim | |
| 8,067,775 B2 | 11/2011 | Miyairi et al. | |
| 2005/0196892 A1* | 9/2005 | Yamagata et al. | 438/79 |
| 2009/0243972 A1* | 10/2009 | Her et al. | 345/55 |

FOREIGN PATENT DOCUMENTS

| | | |
|---|---|---|
| KR | 1020010060829 A | 7/2001 |
| KR | 1020010084456 A | 9/2001 |
| KR | 100707013 B1 | 4/2007 |
| KR | 1020080113596 A | 12/2008 |
| KR | 1020090090493 A | 8/2009 |
| KR | 1020090100949 A | 9/2009 |
| KR | 1020110016242 A | 2/2011 |
| KR | 1020110075518 A | 7/2011 |
| KR | 1020110139873 A | 12/2011 |

* cited by examiner

*Primary Examiner* — Chuong A Luu
*Assistant Examiner* — Rodolfo Fortich
(74) *Attorney, Agent, or Firm* — Cantor Colburn LLP

(57) ABSTRACT

A display device includes: a substrate; a signal line on the substrate; a signal input line on the substrate and connected to a driver; a first insulating layer between the signal line and the signal input line; a second insulating layer on the signal line, the signal input line and the first insulating layer; an organic layer on the second insulating layer; a first contact hole defined in the organic layer, the first insulating layer and the second insulating layer and exposing the signal line; a second contact hole defined in the organic layer and the second insulating layer and exposing the signal input line; and a connecting member on the organic layer, and connecting the signal line and the signal input line to each other through the first contact hole and the second contact hole, respectively.

20 Claims, 9 Drawing Sheets

DISPLAY DEVICE

This application claims priority to Korean Patent Application No. 10-2012-0142971 filed on Dec. 10, 2012, and all the benefits accruing therefrom under 35 U.S.C. §119, the entire contents of which are incorporated herein by reference.

BACKGROUND (a) Field

The invention relates to a display device. More particularly, the invention relates to a display device preventing a disconnection defect of a connecting member connecting elements forming a driver.

(b) Description of the Related Art

In general, a display device includes a display panel including a plurality of pixels as units displaying an image, and a plurality of drivers. The drivers include a data driver applying a data voltage to a pixel, and a scan driver applying a gate signal controlling transmission of the data voltage. Conventionally, a method in which the scan driver and the data driver are mounted to a printed circuit board ("PCB") as a chip type and are connected to the display panel, or are directly mounted to the display panel, is generally used. However, where a scan driver does not require high mobility of a thin film transistor channel, a structure in which the scan driver is not disposed as an additional chip but is integrated with the display panel has been developed.

SUMMARY

The invention provides a display device which reduces or effectively prevents a disconnection defect of a connecting member connecting elements forming a driver.

A display device according to an exemplary embodiment of the invention includes: a substrate; a signal line on the substrate; a signal input line on the substrate and connected to a driver; a first insulating layer between the signal line and the signal input line; a second insulating layer on the signal line, the signal input line and the first insulating layer; an organic layer on the second insulating layer; a first contact hole defined in the organic layer, the first insulating layer and the second insulating layer, and exposing the signal line; a second contact hole defined in the organic layer and the second insulating layer, and exposing the signal input line; and a connecting member on the organic layer, and connecting the signal line and the signal input line to each other through the first contact hole and the second contact hole, respectively.

The signal input line may include a semiconductor layer, and a metal layer on the semiconductor layer.

The organic layer may include at least one of a color filter, a black matrix, a black column spacer and a transparent organic insulating material.

The signal line may be between the first insulating layer and the substrate, and the first insulating layer may be between the signal input line and the substrate.

The first insulating layer and the second insulating layer may include an inorganic insulating material including silicon oxide (SiOX) and silicon nitride (SiNx).

The signal line may transmit a clock signal.

The driver may be integrated on the substrate.

The driver may be a gate driver which transmits a gate signal.

The connecting member may include a transparent metal material such as indium tin oxide ("ITO") and indium zinc oxide ("IZO").

The substrate may include a display area, and a peripheral area enclosing the display area and positioned at an edge thereof. The signal line, the driver and the signal input line may be in the peripheral area.

The display device may further include a plurality of signal lines and a plurality of signal input lines, and one signal input line of the plurality of signal input lines may overlap one signal line of the plurality of signal lines.

A distal end of the one signal input line may be between adjacent signal lines; and the second contact hole may expose the distal end of the signal input line.

The display device may further include a plurality of signal lines and a plurality of signal input lines, and the plurality of signal input lines are separated from the plurality of signal lines.

The second contact hole may be at the edge of the signal input line nearest the plurality of signal lines.

The organic layer may overlap two signal lines of the plurality of signal lines.

The display device may further include a plurality of signal input lines, and the organic layer may include a plurality patterns. A number of the patterns may be the same as a number of the signal input lines.

The plurality of organic layer patterns may have a different length from each other.

The plurality of organic layer patterns may have a same length as each other.

The display device may further include a plurality of signal lines. The plurality of organic layer patterns may respectively overlap an edge of the signal input lines and each of the plurality of signal lines.

The display device may further include a plurality of signal lines and a plurality of signal input lines. The organic layer may include one, single, unitary pattern overlapping an edge of each of the plurality of signal input lines and each of the plurality of signals.

This display device according to one or more exemplary embodiment of the invention has the following effects.

The display device according to one or more exemplary embodiment of the invention includes the organic layer on the insulating layer including the inorganic insulating material such that deformation of the insulating layer and the underlying semiconductor layer may be reduced or effectively prevented in a process of forming the contact holes.

Accordingly, a disconnection defect of the connecting member on the insulating layer may be reduced or effectively prevented.

BRIEF DESCRIPTION OF THE DRAWINGS

The above and other features of this disclosure will become more apparent by describing in further detail exemplary embodiments thereof with reference to the accompanying drawings, in which.

DETAILED DESCRIPTION

Figure 1:
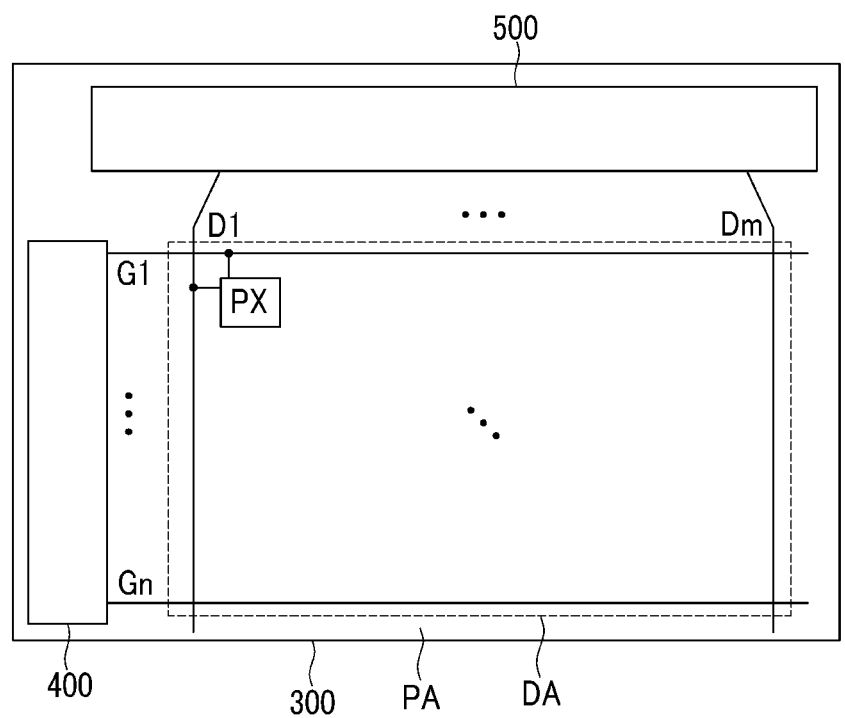
FIG. 1 is a block diagram of an exemplary embodiment of a display device according to the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In the drawings, the thickness of layers, films, panels, regions, etc., are exaggerated for clarity. Like reference numerals designate like elements throughout the specification. As used herein, connected may refer to elements being physically and/or electrically connected to each other. As used herein, the term "and/or" includes any and all combinations of one or more of the associated listed items.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "under" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

A driver includes electrical elements such as a plurality of transistors and a plurality of capacitors, and each electric element includes at least one conductive layer. The electric element included in the driver or the electric element of the driver and an external input/output terminal may be electrically connected to each other through a connection. Where the connection is used to electrically connect the electric element and the external terminal, an insulating layer may be disposed between connecting members or between the terminal and the connecting member. Contact holes may be defined in the insulating layer to electrically connect the element and the connecting member or the terminal and the connecting member.

However, in a process of forming a contact hole, the insulating layer may be deformed such that the connecting member may be disconnected. Therefore, there remains a need for a display device and a method of forming thereof, which reduces or effectively prevents disconnection of the connecting member which connects elements of the driver.

Firstly, referring to FIG. 1, an exemplary embodiment of a display device according to the invention will be described.

FIG. 1 is a block diagram of an exemplary embodiment of a display device according to the invention.

The exemplary embodiment of the display device includes a display panel 300, a gate driver 400 and a data driver 500.

The display panel 300 includes a plurality of gate lines G1-Gn, a plurality of data lines D1-Dm, and a plurality of pixels PX connected to the plurality of gate lines G1-Gn and the plurality of data lines D1-Dm. The display panel 300 may include a display area DA in which the plurality of pixels PX are arranged, and a peripheral area PA near the display area DA such as surrounding the display area DA but not being limited thereto or thereby. The gate lines G1-Gn transmit a gate signal and the data lines D1-Dm transmit a data voltage.

Each pixel PX may include a switching element and a pixel electrode that are connected to a gate line of the gate lines G1-Gn and a data line of the data lines D1-Dm. The switching element may be a three-terminal element such as a thin film transistor integrated in the display panel 300.

The data driver 500 is connected to the data lines D1-Dm to transmit the data voltage. The data driver 500 may be directly mounted in the peripheral area PA of the display panel 300, may be integrated directly in the peripheral area PA in the same manufacturing process as the switching element including the pixel PX, or may be positioned on a flexible printed circuit film attached to the display panel 300 differently from FIG. 1.

The scan driver 400 is integrated in the peripheral area PA of the display panel 300 and sequentially transmits the gate signal to the plurality of gate lines G1-Gn. The gate signal includes a gate-on voltage Von and a gate-off voltage Voff. The gate driver 400 receives a scanning start signal STV instructing an output start of a gate-on pulse, a gate clock signal CPV controlling output timing of the gate-on pulse, and clock signals CK and CKB to sequentially drive the plurality of gate lines G1-Gn. Signal lines to apply these signals to the gate driver 400 may be disposed in the peripheral area PA of the display panel 300.

Various elements in addition to the display panel 300, the scan driver 400 and the data driver 500 of the exemplary embodiment of the display device according to the invention may include, but are not limited to, one or more electrical element such as a transistor, a capacitor and a diode. The electrical element or wiring connected thereto may include at least one conductive layer. When two electrical elements are connected to each other, or one electrical element and an external signal input/output terminal are connected to each other, different conductive layers may be electrically connected to each other. In an exemplary embodiment according to the invention, the different conductive layers are electrically connected to each other through a connection.

An exemplary embodiment of a connection structure of the conductive layers positioned at different layers of the display panel according to the invention will be described with reference to FIG. 2 and FIG. 3.

Figure 2:
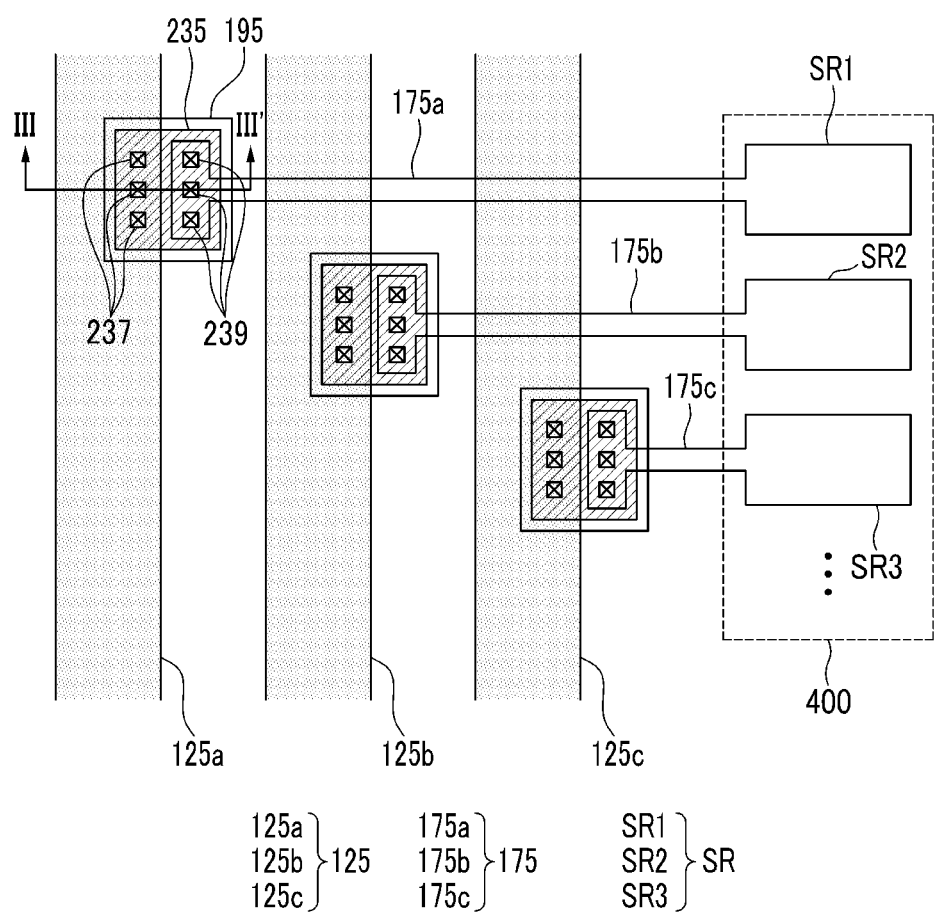
FIG. 2 is a top plan view partially showing an exemplary embodiment of a peripheral area of a display device according to the invention.
Figure 3:
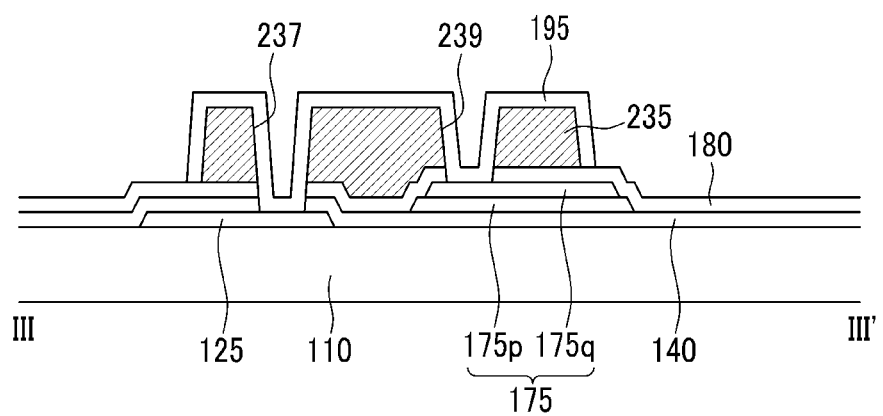
FIG. 3 is a cross-sectional view showing the peripheral area of the display device taken along line III-III' of FIG. 2.

FIG. 2 is a top plan view showing an exemplary embodiment of a peripheral area of a display device according to the invention, and FIG. 3 is a cross-sectional view showing the peripheral area of the display device taken along line III-III' of FIG. 2.

A signal line 125 close to the gate driver 400 is disposed on an insulation substrate 110. In the display device, a gate line and a gate electrode which is connected to the gate line, may be in the display area DA and include a gate conductive material or gate conductive layer.

The signal line 125 is disposed in the peripheral area PA. and may include a material such as the gate conductive layer of the gate line and the gate electrode which are in the display area. That is, the signal line 125, the gate line and the gate electrode may be in a same layer of the display panel 300. The signal line 125 may include an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), or the like.

The signal line 125 may have a single-layer structure or a multi-layer structure such as a multi-film structure including at least two conductive layers (not shown). In exemplary embodiments, for example, the multi-film structure may include a dual layer including a lower conductive layer and an upper conductive layer. The lower conductive layer may include a metal having lower resistivity to reduce a signal delay or a voltage drop, for example, the aluminum-based metal, the silver-based metal or the copper-based metal. The upper conductive layer may include a material having an excellent contact characteristic such as the molybdenum-based metal, chromium, tantalum, or titanium along with another material, for example, a metal oxide such as indium tin oxide ("ITO") or indium zinc oxide ("IZO"). Examples of the lower conductive layer and the upper conductive layer of the signal line 125 include, but are not limited to, a chromium lower conductive layer and an aluminum (alloy) upper conductive layer, and an aluminum (alloy) lower conductive layer and a molybdenum (alloy) upper conductive layer. However, the signal line 125 may include various metals or conductors.

The signal line 125 may be applied with the clock signal. The display device may include a plurality of signal lines 125, for example, as shown in FIG. 2, three signal lines 125a, 125b and 125c. The plurality of signal lines 125 may be applied with clock signals having different timings. As an alternative exemplary embodiment, the display device may include six signal lines 125. Among the six signal lines, three signal lines 125 may be applied with the clock signals and the remaining three signal lines 125 may be applied with clock-bar signals. The plurality of signal lines 125 are disposed separated from each other by a predetermined distance.

A first insulating layer 140 including an inorganic insulating material including silicon oxide (SiOX) or silicon nitride (SiNx) is disposed on the signal lines 125. The first insulating layer 140 is disposed on an entire surface of the insulation substrate 110 including the signal lines 125 thereon.

The gate driver 400 includes a plurality of stages SR, and a signal input line 175 extending from each stage SR is disposed on the first insulating layer 140.

A plurality of signal input lines 175 may be disposed between the plurality of signal lines 125 and the plurality of stages SR. In FIG. 2, for example, the gate driver 400 includes three stages SR1, SR2 and SR3 and one signal input line 175 is connected between each of the three stages SR1, SR2 and SR3 and the plurality of signal lines 125a, 125b and 125c, such as three signal input lines 175a, 175b and 175c. However, in an alternative exemplary embodiment the gate driver 400 may include four or more stages SR, and four or more signal input lines 175 may be respectively connected to the four or more stages SR.

Each signal input line 175 is disposed to be relatively close to a signal line 125. At least one signal input line 175 among the plurality of signal input lines 175 may be disposed between the plurality of signal lines 125. The signal input line 175 disposed between a plurality of signal lines 125 may overlap at least one signal line 125.

In FIG. 2, a first signal input line 175a connected to the first stage SR1 is positioned between a first signal line 125a and a second signal line 125b, and overlaps the second signal line 125b and a third signal line 125c. A distal or terminal end of the first signal input line 175a is between the first signal line 125a and the second signal line 125b. The stage SR1 positioned at the uppermost side of the gate driver 400 among the plurality of stages SR is regarded as the first stage SR1, and the signal line 125a positioned at the leftmost side among the plurality of signal lines 125 is regarded as the first signal line 125a. Also, a second signal input line 175b connected to the second stage SR2 is positioned between the second signal line 125b and the third signal line 125c and overlaps the third signal line 125c. A distal or terminal end of the second signal input line 175b is between the second signal line 125b and the third signal line 125c. Further, a third signal input line 175c connected to the third stage SR3 is positioned at the right side of the third signal line 125c. A distal or terminal end of the third signal input line 175c is between the third signal line 125c and the third state SR3.

The distal or terminal end of the signal input line 175 may have a wider width or area than the remaining portion of the signal input line 175. In the plan view of FIG. 2, the end of the signal input line 175 is quadrangular, however, the shape thereof may be variously changed. The signal input line 175 may be elongated in a first direction, and a width of the signal input line 175 may be taken substantially perpendicular to the first direction, e.g., a second direction.

The signal input line 175 may include a semiconductor layer 175p, and a metal layer 175q disposed on the semiconductor layer 175p. The gate driver 400 and the signal input line 175 are disposed in the peripheral area PA. The semiconductor layer 175p of the signal input line 175 may include a semiconductor material. The semiconductor material of the signal input line 175 in the peripheral area PA may be the same as a semiconductor material of a semiconductor layer in the display area DA. The metal layer 175q of the signal input line 175 may include a data conductive layer. The data conductive layer of the signal input line 175 in the peripheral area PA may be the same as a data conductive layer of the data line, a source electrode and a drain electrode in the display area DA. That is, the signal input line 175, the data line, the source electrode and the drain electrode may be in same layer of the display panel 300.

The metal layer 175q may include a metal such as molybdenum, chromium, tantalum, and titanium or alloys thereof. The metal layer 175q may have a single-layer structure or a multi-layer structure such as a multi-film structure including at least two conductive layers (not shown). Examples of a multi-film structure includes, but are not limited to, a dual layer structure including a chromium or molybdenum (alloy) lower conductive layer and an aluminum (alloy) upper conductive layer, and a triple layer structure including a molybdenum (alloy) lower conductive layer, an aluminum (alloy) middle conductive layer, and a molybdenum (alloy) upper conductive layer. However, the metal layer 175q may include various metals or conductors.

Although not shown, an ohmic contact including a material such as n+ hydrogenated amorphous silicon doped with an n-type impurity at a high concentration or of silicide may be disposed between the semiconductor layer 175p and the metal layer 175q of the signal input line 175.

In an exemplary embodiment of manufacturing a display device and/or a display panel 300, the semiconductor layer 175p and the metal layer 175q of the signal input line 175 may be simultaneously patterned by using a same mask. Where the semiconductor layer 175p and the metal layer 175q are simultaneously patterned by using a same mask, the width of the underlying semiconductor layer 175p may be relatively greater than a width of the metal layer 175q. Accordingly, the upper surface of the underlying semiconductor layer 175p may be exposed at both of opposing width edges of the metal layer 175q.

In FIG. 2 and FIG. 3, the signal line 125 and the signal input line 175 are separated by the predetermined interval, however the invention is not limited thereto, and at least portions of the signal line 125 and the signal input line 175 may overlap in an alternative embodiment.

A second insulating layer 180 including the inorganic insulating material such as silicon oxide (SiOX) and silicon nitride (SiNx) is disposed on the signal input line 175. The second insulating layer 180 is disposed on substantially an entire surface of the insulation substrate 110 including the signal input line 175 thereon.

An organic layer 235 is disposed on the second insulating layer 180. The organic layer 235 is disposed to overlap the signal line 125 and the signal input line 175. In FIG. 2, the organic layer 235 is disposed to cover the distal or terminal end of one signal input line 175 and a portion of the signal line 125 adjacent thereto in a direction away from the stages SR. However, the invention is not limited thereto, and in an exemplary embodiment the organic layer 235 may have a wider area or narrower area than what is relatively shown in FIG. 2 and FIG. 3.

In the plan view of FIG. 2, the organic layer 235 is quadrangular, however, the invention is not limited thereof, and in an alternative exemplary embodiment the organic layer 235 may have various shapes. The organic layer 235 may be considered a discrete or island-shaped feature.

The organic layer 235 is disposed in the peripheral area PA and may include a photosensitive film including a photosensitive material. The photosensitive film including the photosensitive material of the organic layer 235 in the peripheral area PA may be the same a material of a color filter in the display area DA. That is, in a color filter on array ("COA") structure in which the color filter is disposed on a same substrate as the thin film transistor, in an exemplary embodiment of manufacturing a display device and/or a display panel 300, the organic layer 235 may be formed when forming the color filter. That is, the organic layer 235 and the color filter may be in same layer of the display panel 300. The color filter allows the pixel PX to display a unique color. One color filter may represent one primary color, and the primary color may include one or more of three primary colors such as red, green and blue. That is, the color filter may include a red color filter, a green color filter a blue color filter, etc.

A first contact hole 237 is defined in the organic layer 235, the first insulating layer 140 and the second insulating layer 180, and exposes the signal line 125. Also, a second contact hole 239 is defined in the organic layer 235 and the second insulating layer 180, and exposes the signal input line 175.

The first contact hole 237 and the second contact hole 239 may be disposed in plural. In an exemplary embodiment, for example, as shown in FIG. 2, three first contact holes 237 and three second contact holes 239 are defined for one portion of the organic layer 235.

The organic layer 235 has a relatively large cross-sectional thickness compared to other layers of the display panel 300. The relatively thick organic layer 235 is disposed on the second insulating layer 180 such that damage or deformation to the second insulating layer 180 positioned under the organic layer 235 may be reduced or effectively prevented in an etching step of a manufacturing process which forms the first contact hole 237 and the second contact hole 239. Furthermore, the etching process does not influence the semiconductor layer 175p disposed directly under the second insulating layer 180 such that damage or deformation of the portion of the semiconductor layer 175p exposed by the metal layer 175q may be reduced or effectively prevented. In the plan view, the second contact hole 239 is spaced apart from the portion of the semiconductor layer 175p exposed by the metal layer 175q A connecting member 195 to connect the signal line 125 and the signal input line 175 to each other through the first contact hole 237 and the second contact hole 239 is disposed on the organic layer 235. The connecting member 195 is disposed in the peripheral area PA and may include a conductive material. The conductive material of the connecting member 195 in the peripheral area PA may be the same as a conductive material of a pixel electrode in the display area DA. That is, the connecting member 195 and the pixel electrode may be in a same layer of the display panel 300. In exemplary embodiments, for example, the connecting member 195 may include a transparent conductive material such as ITO or IZO, or a reflective metal such as aluminum, sliver, chromium or alloys thereof.

In an exemplary embodiment of the invention, a protruded portion is not generated at an upper surface and a side surface of the organic layer 235 positioned under the connecting member 195 and a side surface where the second insulating layer 180 is exposed. That is, a lower layer or surface of the connecting member 195 is substantially flat such that disconnection of the connecting member 195 may be reduced or effectively prevented.

In FIG. 2 and FIG. 3, the connecting member 195 is disposed to cover substantially the entirety of the organic layer 235. That is, a planar area of the connecting member 195 is larger than a planar area of the organic layer 235. However, the invention is not limited thereto, and the planar area of the connecting member 195 may be smaller than the planar area of the organic layer 235.

The connecting member 195 is physically and/or electrically connected to the signal line 125 and the signal input line 175 such that the clock signal applied to the signal line 125 is transmitted to the gate driver 400 through the signal input line 175.

In the exemplary embodiment of the display device according to the invention, the connection structure between the gate driver 400 and the signal line 125 is integrated on the insulation substrate 110, however, the invention is not limited thereto. An alternative exemplary embodiment may include the data driver 500 integrated on the insulation substrate 110, and the same or similar connection structure between the data driver and other signal lines.

Next, referring to FIG. 4 and FIG. 5, another exemplary embodiment of a display device according to the invention will be described.

Figure 4:
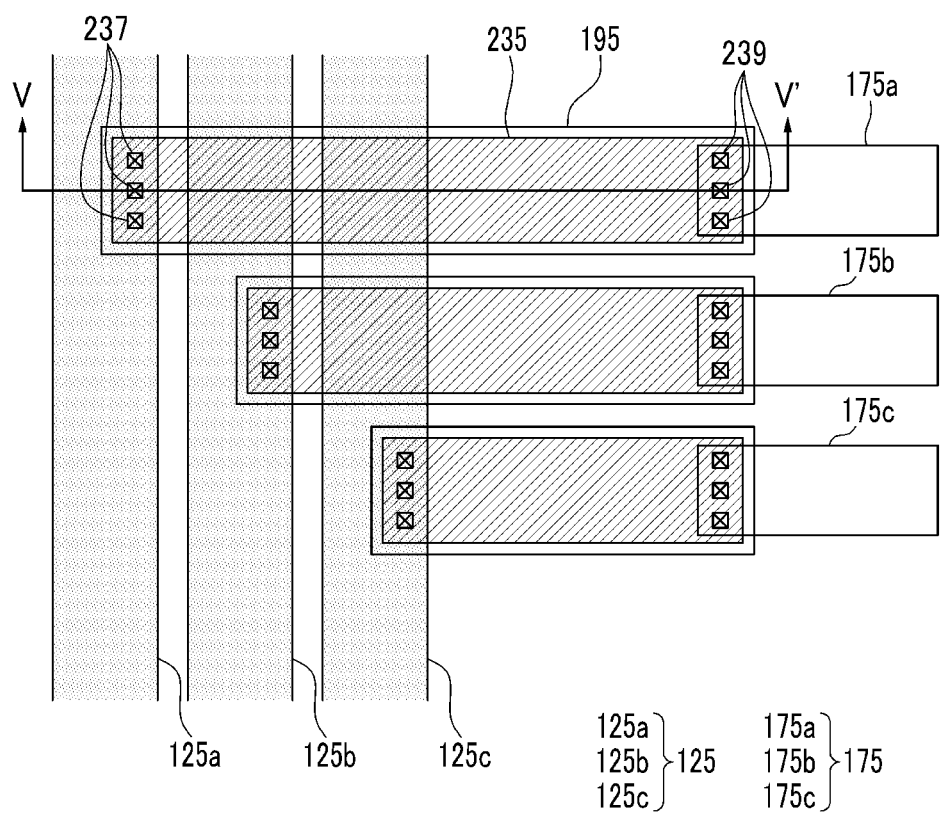
FIG. 4 is a top plan view partially showing another exemplary embodiment of a peripheral area of a display device according to the invention.
Figure 5:
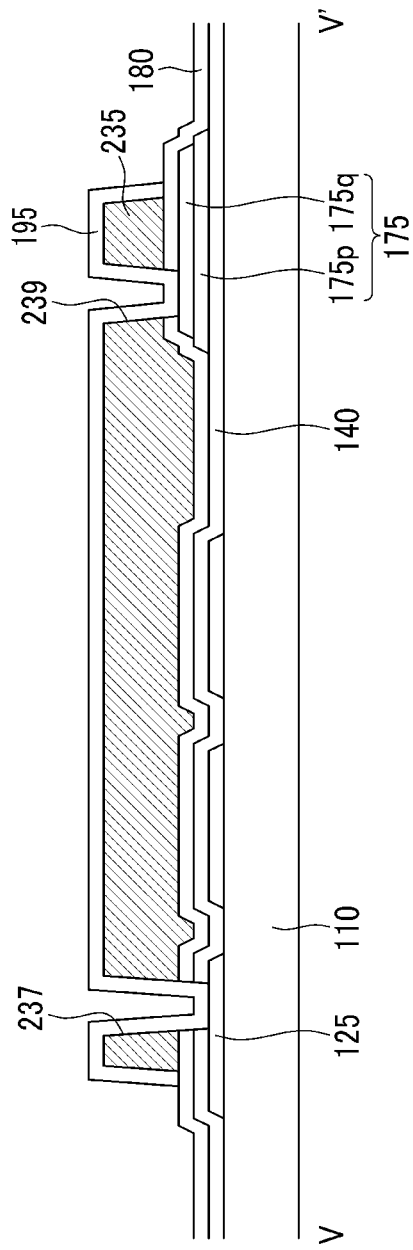
FIG. 5 is a cross-sectional view showing the peripheral area of the display device taken along line V-V' of FIG. 4.

The exemplary embodiment of the display device according to the invention shown in FIG. 4 and FIG. 5 is substantially the same as the previous exemplary embodiment such that the description of the same portions is omitted and differences will be described. The largest difference of the exemplary embodiment of the display device according to the invention shown in FIG. 4 and FIG. 5 from the previous exemplary embodiment is a position of the distal or terminal end of the signal input line, and the position and the planar area of other elements, which will be described.

FIG. 4 is a top plan view showing another exemplary embodiment of a peripheral area of a display device according to the invention, and FIG. 5 is a cross-sectional view showing the peripheral area of the display device taken along line V-V' of FIG. 4.

The illustrated exemplary embodiment of the display device includes a display panel 300, a gate driver 400 and a data driver 500 like the previous exemplary embodiment.

Next, a connection structure of conductive layers positioned in different layers in the peripheral area of the display device will be described.

The signal line 125 close to the gate driver 400 is disposed on the insulation substrate 110. In the display device, a gate line and a gate electrode which is connected to the gate line, may be in the display area DA and include a gate conductive material or gate conductive layer. The signal line 125 may include a material such as the gate conductive layer and the signal line 125 may be applied with the clock signal. The display device may include a plurality of signal lines 125 and the plurality of signal lines 125 may be respectively applied with different signals.

The first insulating layer 140 including the inorganic insulating material such as silicon oxide (SiOX) and silicon nitride (SiNx) is disposed on the entire surface of the insulation substrate 110 including the signal lines 125 thereon.

A signal input line 175 is disposed on the first insulating layer 140. The display device may include a plurality of signal input lines 175. The plurality of signal input lines 175 may be positioned at the right side of the rightmost signal line 125. That is, the plurality of signal input lines 175 do not overlap any of the plurality of signal lines 125.

The signal input line 175 may include the metal layer 175$q$ disposed on the semiconductor layer 175$p$. The semiconductor layer 175$p$ may include the semiconductor material, and the metal layer 175$q$ may include of the data conductive layer material.

In FIG. 4 and FIG. 5, the signal line 125 and the signal input line 175 are separated by the predetermined interval, however, the invention is not limited thereto, and the signal input line 175 may overlap at least a portion of the signal line 125 positioned at the rightmost side thereof.

In the previous exemplary embodiment, the plurality of signal lines 125 is disposed with the predetermined interval therebetween, and the distal or terminal end of the signal input line 175 is positioned between adjacent signal lines 125. However in the illustrated exemplary embodiment, the end of the signal input line 175 is not disposed between the adjacent signal lines 125 and the interval between the adjacent signal lines 125 is narrower. In the illustrated exemplary embodiment, the interval between the plurality of signal lines 125 positioned in the peripheral area PA is reduced, thereby reducing a bezel width of the display device. A bezel of the display device may include the peripheral area PA.

The second insulating layer 180 including the inorganic insulating material such as silicon oxide (SiOX) and silicon nitride (SiNx) is disposed on substantially the entire surface of the insulation substrate 110 including the signal input line 175 thereon.

The organic layer 235 is disposed on the second insulating layer 180. The organic layer 235 is disposed to overlap the signal lines 125 and the signal input lines 175. The organic layer 235 may collectively include a plurality of discrete or island-shaped patterns.

In the exemplary embodiment, for example, as shown in FIG. 4, a first pattern of the organic layer 235 is disposed to overlap at least a portion of the first signal line 125$a$ and the first signal input line 175$a$. The organic layer 235 pattern positioned at the uppermost side among the plurality of organic layer 235 patterns is regarded as the first pattern, the signal line 125$a$ positioned at the leftmost side among the plurality of signal lines 125 is regarded as the first signal line 125$a$, and the signal input line 175$a$ positioned at the uppermost side among the plurality of signal input lines 175 is regarded as the first signal input line 175$a$. Also, the second pattern of the organic layer 235 is disposed to overlap at least a portion of the second signal line 125$b$ and the second signal input line 175$b$. Further, the third pattern of the organic layer 235 is disposed to overlap at least a portion of the third signal line 125$c$ and the third signal input line 175$c$. Among the patterns of the organic layer 235, the first pattern of the organic layer 235 is the longest, the second pattern is shorter than the first pattern, and the third pattern is the shortest, where lengths are taken in the first direction.

However, the exemplary embodiment in FIG. 4 and FIG. 5 described above is only one example, and the organic layer 235 may have various patterns and/or may include the photosensitive film of the color filter.

The first contact hole 237 is defined in the organic layer 235, the first insulating layer 140 and the second insulating layer 180, and exposes the signal line 125. That is, the first contact hole 237 is defined at the portion where the organic layer 235 and the signal line 125 overlap each other.

Also, the second contact hole 239 is defined in the organic layer 235 and the second insulating layer 180, and exposes the signal input line 175. That is, the second contact hole 239 is disposed at the portion where the organic layer 235 and the signal input line 175 overlap each other.

A connecting member 195 to connect the signal line 125 and the signal input line 175 to each other through the first contact hole 237 and the second contact hole 239 is disposed on the organic layer 235.

Next, referring to FIG. 6 and FIG. 7, still another exemplary embodiment of a display device according to the invention will be described.

Figure 6:
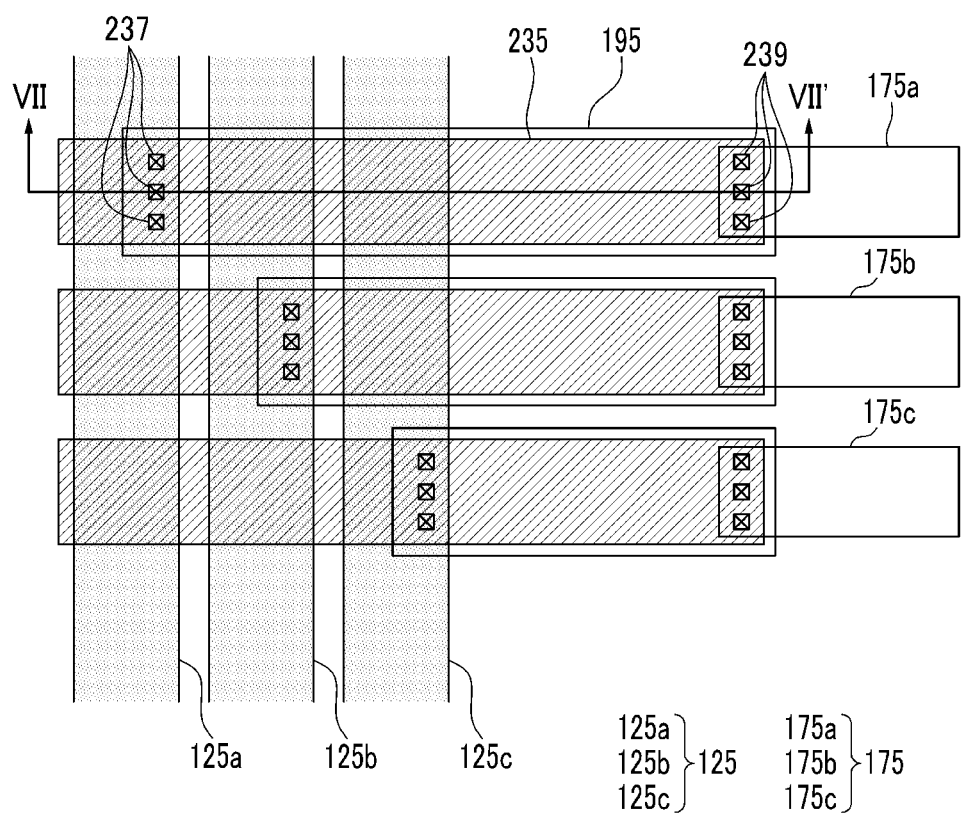
FIG. 6 is a top plan view partially showing still another exemplary embodiment of a peripheral area of a display device according to the invention.
Figure 7:
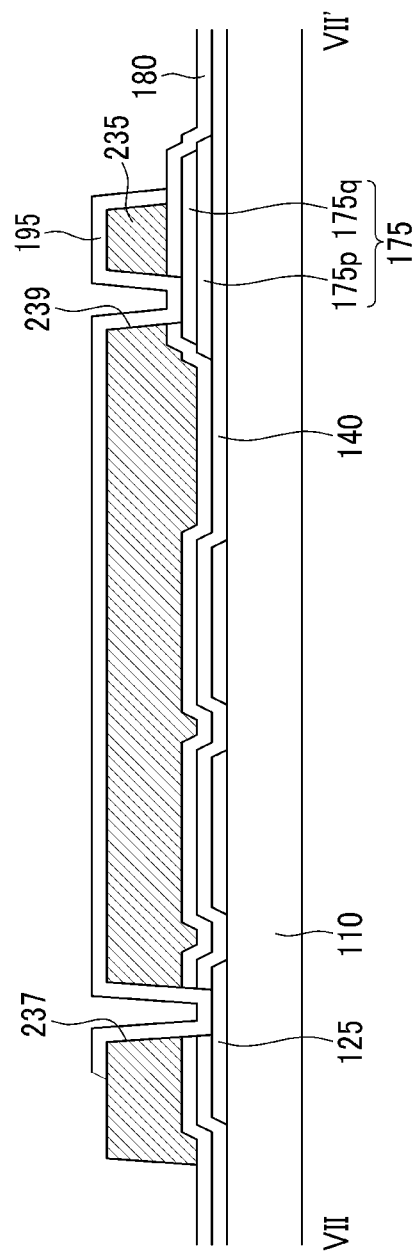
FIG. 7 is a cross-sectional view showing the peripheral area of the display device taken along line VII-VII' of FIG. 6.

The exemplary embodiment of the display device according to the invention shown in FIG. 6 and FIG. 7 is substantially the previous exemplary embodiment shown in FIG. 4 and FIG. 5 such that the description of the same portions is omitted and differences will be described. The largest difference of the exemplary embodiment of the display device according to the invention shown in FIG. 5 and FIG. 6 from the previous exemplary embodiment is a length of the plurality of patterns of the organic layer, and this will be described.

FIG. 6 is a top plan view showing still another exemplary embodiment of a peripheral area of a display device according to the invention, and FIG. 7 is a cross-sectional view showing the peripheral area of the display device according to the invention taken along line VII-VII' of FIG. 6.

The illustrated exemplary embodiment of the display device according to the invention includes a display panel 300, a gate driver 400 and a data driver 500 like the previous exemplary embodiment.

Next, a connection structure of conductive layers positioned in different layers in the peripheral area of the display device will be described.

The signal line 125 is disposed on the insulation substrate 110, the first insulating layer 140 is disposed on the signal line 125, and the signal input line 175 is disposed on the first insulating layer 140.

The second insulating layer 180 is disposed on the signal input line 175, and the organic layer 235 is disposed on the second insulating layer 180.

The organic layer 235 is disposed to overlap the signal line 125 and the signal input line 175. The organic layer 235 may collectively include a plurality of discrete or island-shaped patterns. The plurality of patterns of the organic layer 235 may have the same or substantially similar length.

In the exemplary embodiment, for example, as shown in FIG. 6, the first pattern of the organic layer 235 is disposed to overlap at least a portion of each of first to third signal lines 125a, 125b and 125c, and a first signal input line 175a. The organic layer 235 pattern positioned at the uppermost side among the plurality of patterns of the organic layer 235 is regarded as the first pattern, and the signal input line 175a positioned at the uppermost side among a plurality of signal input line 175 is regarded as the first signal input line 175a. Also, the second pattern of the organic layer 235 is disposed to overlap at least a portion of the first to third signal lines 125a, 125b and 125c, and the second signal input line 175b. Also, the third pattern of the organic layer 235 is disposed to overlap at least a portion of the first to third signal lines 125a, 125b and 125c, and the third signal input line 175c. Among the patterns of the organic layer 235, the first pattern, the second pattern and the third pattern of the organic layer 235 have the same or substantially the same length, for example, the first to third patterns may have a similar length within an error range of a process of a manufacturing method for forming such patterns.

Accordingly, the first pattern, the second pattern and the third pattern of the organic layer 235 have substantially the same overlapping area with the first to third signal lines 125a, 125b and 125c, and the first to third signal input lines 175a, 175b and 175c. Accordingly, electrical loads of the plurality of signal input lines 175 respectively connected to the plurality of signal lines 125 may be the same or substantially the same.

In the above, the first signal line 125a is connected to the first signal input line 175a, the second signal line 125b is connected to the second signal input line 175b and the third signal line 125c is connected to the third signal input line 175c, however, the invention is not limited thereto. The connection of the plurality of signal lines 125a, 125b and 125c and the plurality of signal input lines 175a, 175b and 175c may be variously changed. In an alternative exemplary embodiment, for example, the first signal line 125a may be connected to the first signal input line 175a, the second signal line 125b may be connected to the third signal input line 175c, and the third signal line 125c may be connected to the second signal input line 175b. Or, the first signal line 125a may be connected to the second signal input line 175b, the second signal line 125b may be connected to the third signal input line 175c, and the third signal line 125c may be connected to the first signal input line 175a. Or, the first signal line 125a may be connected to the second signal input line 175b, the second signal line 125b may be connected to the first signal input line 175a, and the third signal line 125c may be connected to the third signal input line 175c.

The first and second contact holes 237 are defined in the organic layer 235 and the second insulating layer 180, and the connecting member 195 connecting the signal line 125 and the signal input line 175 to each other is disposed on the organic layer 235. The connecting member 195 exposes a portion of the organic layer 235 patterns.

Next, referring to FIG. 8 and FIG. 9, yet another exemplary embodiment of a display device according to the invention will be described.

Figure 8:
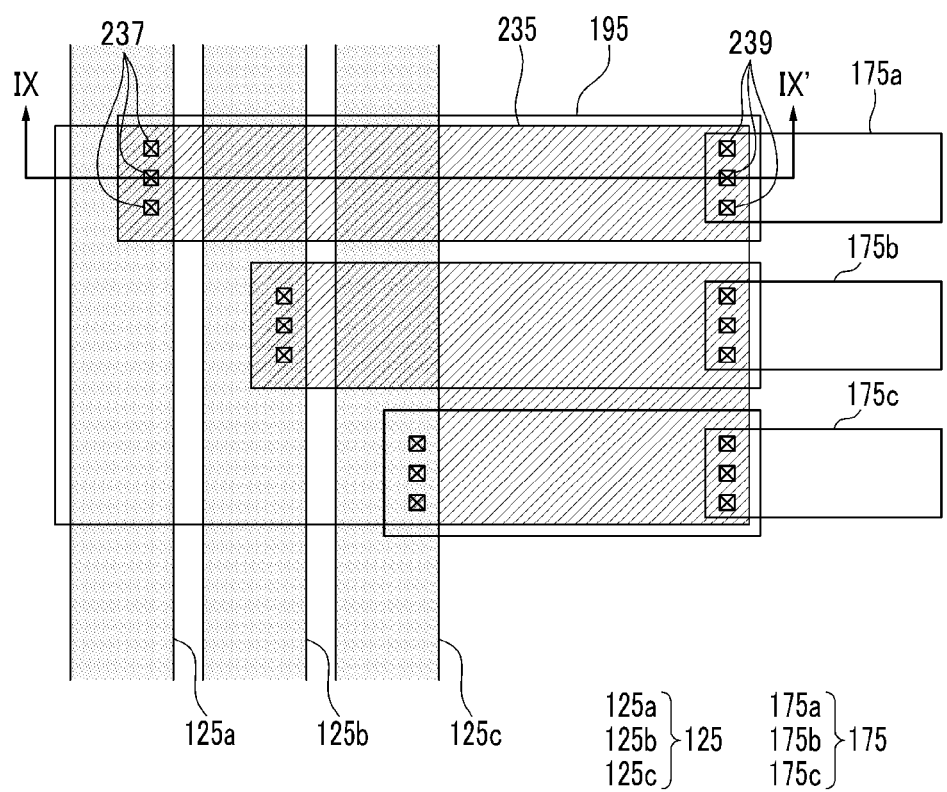
FIG. 8 is a top plan view partially showing yet another exemplary embodiment of a peripheral area of a display device according to the invention.
Figure 9:
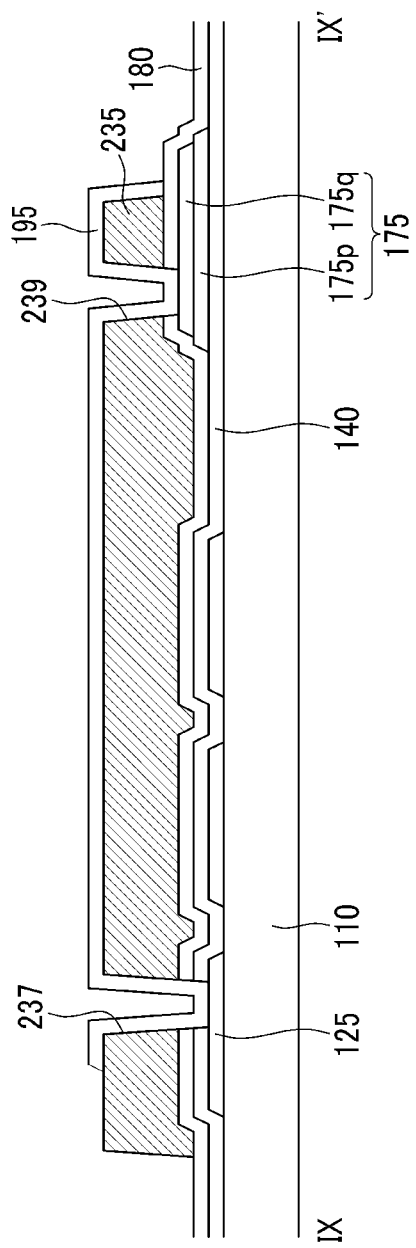
FIG. 9 is a cross-sectional view showing the peripheral area of the display device taken along line IX-IX' of FIG. 8.

The illustrated exemplary embodiment of the display device according to the invention shown in FIG. 8 and FIG. 9 is substantially the same as the previous exemplary embodiment shown in FIG. 6 and FIG. 7 such that the description of the same portions is omitted and differences will be described. The largest difference of the exemplary embodiment in FIG. 8 and FIG. 9 from the previous exemplary embodiment is that an organic layer is disposed as one unitary, indivisible pattern, and this will be described.

FIG. 8 is a top plan view showing yet another exemplary embodiment of a peripheral area of a display device according to the invention, and FIG. 9 is a cross-sectional view showing the peripheral area of the display device according to the invention taken along line IX-IX' of FIG. 8.

The illustrated exemplary embodiment of the display device includes a display panel 300, a gate driver 400 and a data driver 500 like the previous exemplary embodiment.

Next, a connection structure of conductive layers positioned in different layers in the peripheral area of the display device will be described.

The signal line 125 is disposed on the insulation substrate 110, the first insulating layer 140 is disposed on the signal line 125, and the signal input line 175 is disposed on the first insulating layer 140.

The second insulating layer 180 is disposed on the signal input line 175, and the organic layer 235 is disposed on the second insulating layer 180.

The organic layer 235 is disposed to overlap at least a portion of the signal line 125 and the signal input line 175. The organic layer 235 may include a single, unitary indivisible pattern. The single pattern organic layer 235 may overlap the portion of the first to third signal lines 125a, 125b and 125c and overlap the first to third signal input lines 175a, 175b and 175c.

The organic layer 235 may include the photosensitive film of the color filter as described for the previous exemplary embodiments.

Also, the organic layer 235 may include a light blocking member disposed between adjacent color filters in the display area DA. The light blocking member may be disposed in a matrix shape to prevent light leakage generated in a region between two adjacent pixels, and may otherwise be referred to as a black matrix ("BM"). In an exemplary embodiment of a method of manufacturing the display device and/or the display panel 300, the black matrix may be simultaneously formed with a column spacer (not shown) to uniformly maintain an interval between two display device substrates. In one exemplary embodiment of a method of manufacturing the display device and/or the display panel 300, a black photosensitive film is formed (e.g., provided) and is developed by using a slit mask or a halftone mask to control a amount of light to which the photosensitive film is exposed, at a region corresponding to the light blocking member and a region corresponding to the column spacer such that the exposure amount is different. Such a light blocking member is otherwise referred to as a black column spacer ("BCS").

Also, the organic layer 235 may include a transparent organic insulating material. An organic insulating layer (not shown) used for planarizing layers of the display panel in the display area DA may also include the transparent organic insulating material. In an exemplary embodiment of a method of manufacturing the display device and/or the display panel 300, the organic layer 235 may be simultaneously formed with the organic insulating layer used for planarizing layers of the display panel in the display area DA t.

That is, the organic layer 235 may include one or more of the color filter, the black matrix, the black column spacer and the transparent organic insulating material. The various materials of the organic layer 235 may be applied to various exemplary embodiments shown in FIG. 2 to FIG. 7.

The first and second contact holes 237 and 239 are defined in the organic layer 235 and the second insulating layer 180, and the connecting member 195 connecting the signal line 125 and the signal input line 175 to each other is disposed on the organic layer 235.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a substrate;
a signal line on the substrate;
a signal input line on the substrate and connected to a driver;
a first insulating layer between the signal line and the signal input line;
a second insulating layer on the signal line, the signal input line and the first insulating layer;
an organic layer on the second insulating layer;
a first contact hole defined in the organic layer, the second insulating layer and the first insulating layer, and exposing the signal line;
a second contact hole defined in the organic layer and the second insulating layer, and exposing the signal input line, and
a connecting member on the organic layer, wherein the connecting member connects the signal line and the signal input line to each other through the first contact hole and the second contact hole, respectively and a lower layer or surface of the connecting member is substantially flat.

2. The display device of claim 1, wherein
the signal input line comprises a semiconductor layer, and a metal layer on the semiconductor layer.

3. The display device of claim 2, wherein
the organic layer comprises at least one of a color filter, a black matrix, a black column spacer and a transparent organic insulating material.

4. The display device of claim 1, wherein
the signal line is between the first insulating layer and the substrate, and
the first insulating layer is between the signal input line and the substrate.

5. The display device of claim 4, wherein
the first insulating layer and the second insulating layer comprise an inorganic insulating material comprising silicon oxide and silicon nitride.

6. The display device of claim 1, wherein
the signal line transmits a clock signal.

7. The display device of claim 6, wherein
the driver is integrated on the substrate.

8. The display device of claim 7, wherein
the driver is a gate driver which transmits a gate signal.

9. The display device of claim 1, wherein
the connecting member comprises a transparent metal material comprising indium tin oxide or indium zinc oxide.

10. The display device of claim 1, wherein
the substrate comprises a display area, and a peripheral area enclosing the display area and positioned at an edge of the substrate, and
the signal line, the driver and the signal input line are in the peripheral area.

11. The display device of claim 1, further comprising a plurality of signal lines and a plurality of signal input lines, and
one signal input line of the plurality of signal input lines overlaps one signal line of the plurality of signal lines.

12. The display device of claim 11, wherein
a distal end of the one signal input line is between adjacent signal lines; and
the second contact hole exposes the distal end of the signal input line.

13. The display device of claim 1, further comprising a plurality of signal lines and a plurality of signal input lines, and
   the plurality of signal input lines are separated from the plurality of signal lines.

14. The display device of claim 13, wherein
   the second contact hole is at the edge of the signal input line, the edge being nearest to the plurality of signal lines.

15. The display device of claim 14, wherein
   the organic layer overlaps two signal lines of the plurality of signal lines.

16. The display device of claim 1, further comprising a plurality of signal input lines;
   wherein
   the organic layer comprises a plurality of patterns, and
   a number of the patterns is the same as a number of the signal input lines.

17. The display device of claim 16, wherein
   the plurality of organic layer patterns have different lengths from each other.

18. The display device of claim 16, wherein
   the plurality of organic layer patterns have the same length as each other.

19. The display device of claim 18, further comprising a plurality of signal lines;
   wherein the plurality of organic layer patterns respectively overlaps an edge of the signal input lines, and each of the plurality of signal lines.

20. The display device of claim 1, further comprising a plurality of signal lines and a plurality of signal input lines;
   wherein the organic layer comprises one, single, unitary pattern overlapping an edge of each of the plurality of signal input lines and each of the plurality of signal lines.

* * * * *